United States Patent
Enright et al.

(10) Patent No.: US 12,405,065 B2
(45) Date of Patent: Sep. 2, 2025

(54) COOLING APPARATUS

(71) Applicant: Nokia Technologies Oy, Espoo (FI)

(72) Inventors: Ryan Enright, Floral Park, NY (US); Raffaele Luca Amalfi, New Providence, NJ (US); Stefano Grillanda, Springfield, NJ (US)

(73) Assignee: Nokia Technologies Oy, Espoo (FI)

( * ) Notice: Subject to any disclaimer, the term of this patent is extended or adjusted under 35 U.S.C. 154(b) by 230 days.

(21) Appl. No.: 18/229,229

(22) Filed: Aug. 2, 2023

(65) Prior Publication Data

US 2024/0053108 A1    Feb. 15, 2024

(30) Foreign Application Priority Data

Aug. 10, 2022 (EP) ..................... 22189786

(51) Int. Cl.
*F28D 15/02* (2006.01)
*H05K 7/20* (2006.01)
*F21V 23/00* (2015.01)

(52) U.S. Cl.
CPC ..... *F28D 15/0241* (2013.01); *H05K 7/20336* (2013.01); *F21V 23/003* (2013.01)

(58) Field of Classification Search
CPC ............ F28D 15/0241; H05K 7/20336; F21V 23/003
USPC ......................... 165/104.21, 104.33, 104.26
See application file for complete search history.

(56) References Cited

U.S. PATENT DOCUMENTS

| | | | |
|---|---|---|---|
| 11,557,231 B2* | 1/2023 | Wu | G06F 1/20 |
| 11,853,504 B2* | 12/2023 | Wu | G06F 3/04166 |
| 12,046,164 B2* | 7/2024 | Oh | G09F 9/301 |
| 12,146,476 B2* | 11/2024 | Ku | H05K 7/20336 |
| 2005/0180109 A1 | 8/2005 | Miyazaki et al. | 361/700 |
| 2021/0254899 A1* | 8/2021 | Alahyari | F28D 15/0266 |
| 2022/0036772 A1 | 2/2022 | Wu et al. | |
| 2023/0223504 A1* | 7/2023 | Moon | H01L 25/167 257/88 |

FOREIGN PATENT DOCUMENTS

EP     4001820 A1    5/2022

* cited by examiner

Primary Examiner — Joel M Attey
(74) Attorney, Agent, or Firm — McCarter & English LLP

(57) ABSTRACT

Examples of the disclosure relate to an apparatus. The apparatus includes a housing portion and a flexible portion. The housing portion includes one or more heat sources. The flexible portion is configured to be moved between a closed configuration and an open configuration wherein in the closed configuration the flexible portion is housed in the housing portion and in the open configuration the flexible portion is positioned outside of the housing. The flexible portion includes a flexible display and an oscillating heat pipe. The oscillating heat pipe is coupled to the one or more heat sources in the housing portion. The oscillating heat pipe is flexible and configured to move with the flexible portion between the closed configuration and the open configuration. One or more condenser regions of the oscillating heat pipe are positioned in the flexible portion.

14 Claims, 3 Drawing Sheets

Figure 2A:
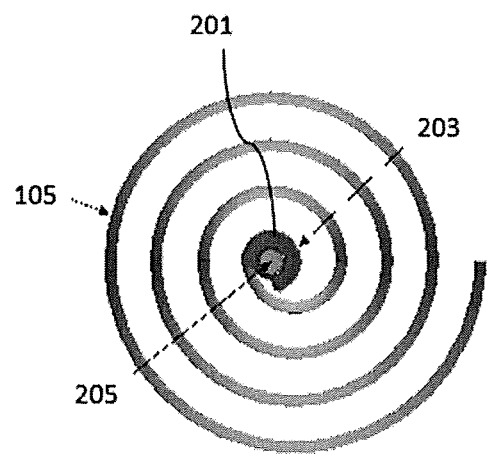

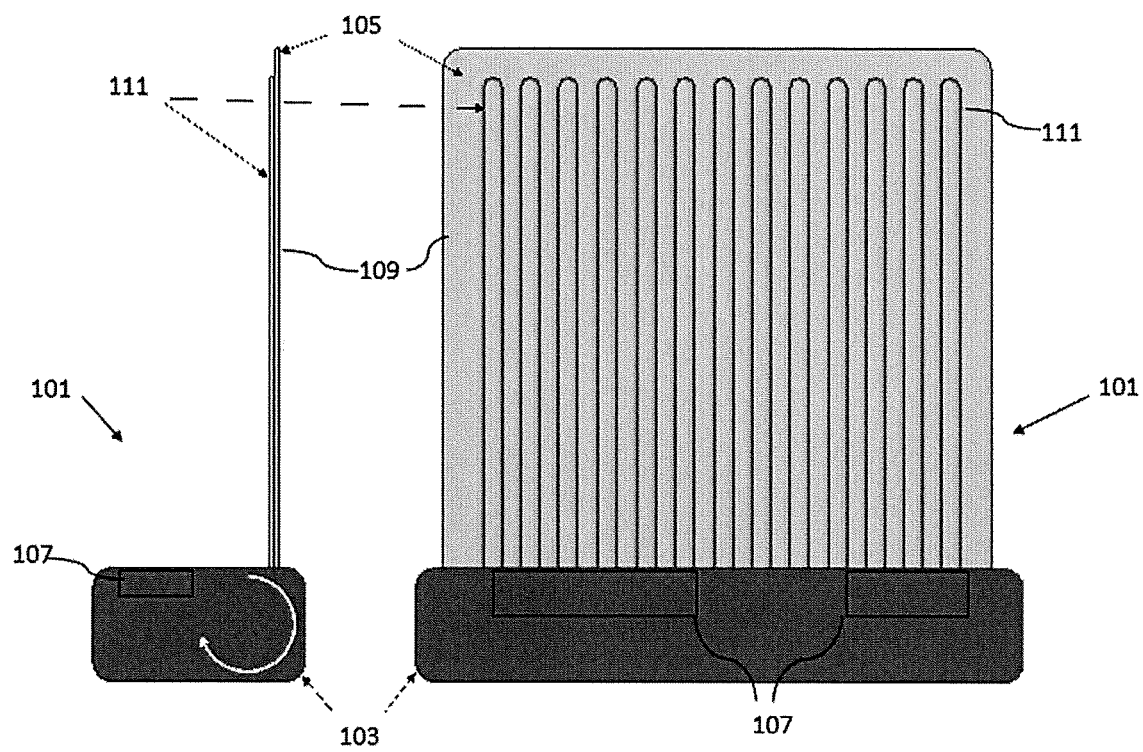
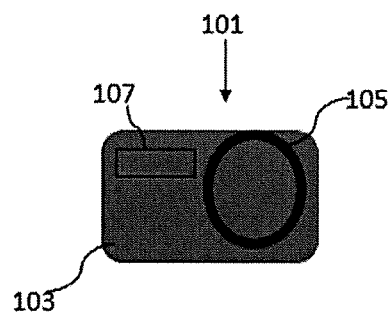
FIG. 1A
FIG. 1B
FIG. 1C

COOLING APPARATUS

TECHNOLOGICAL FIELD

Examples of the disclosure relate to cooling apparatus. Some relate to cooling apparatus for flexible displays.

BACKGROUND

Flexible displays, such as rotatable displays can be used to provide adaptive form factors for electronic devices. For example, a mobile phone with a flexible display could be configured in a first configuration which is more compact and easier to transport and a second configuration which provides a large display area.

BRIEF SUMMARY

According to various, but not necessarily all, examples of the disclosure there may be provided an apparatus comprising:
  a housing portion comprising one or more heat sources;
  a flexible portion configured to be moved between a closed configuration and an open configuration wherein in the closed configuration the flexible portion is housed in the housing portion and in the open configuration the flexible portion is positioned outside of the housing; and
  wherein the flexible portion comprises a flexible display and an oscillating heat pipe and the oscillating heat pipe is coupled to the one or more heat sources in the housing portion and the oscillating heat pipe is flexible and configured to move with the flexible portion between the closed configuration and the open configuration and wherein one or more condenser regions of the oscillating heat pipe are positioned in the flexible portion.

The oscillating heat pipe may be positioned behind the flexible display in the flexible portion.

The one or more condenser regions in the flexible portion may be configured to enable surfaces of the flexible portion to be used as heat rejection surfaces.

The flexible portion may be a rollable portion.

The housing may comprise a rotatable member and one end of the rollable portion may be coupled to the rotatable member such that rotation of the rotatable member enables the rollable portion to be moved between the open configuration and the closed configuration.

The rotatable member may be thermally coupled to a non-rotatable member and one or more heat sources are thermally coupled to the non-rotatable member.

The flexible display may comprise organic light emitting diodes.

The oscillating heat pipe may be configured to transfer heat to one or more organic light emitting diodes in the flexible display.

Pressure within the oscillating heat pipe may be above atmospheric pressure so that the oscillating heat pipe provides structural rigidity to the flexible portion when the flexible portion is in the open configuration.

The oscillating heat pipe may comprise a polymer.

The flexible portion may comprise a diffusion barrier.

The oscillating heat pipe may comprise a first section having a first diameter and a second section having a second diameter such that the different diameters enable different heat transfer rates by the respective sections.

The apparatus may comprise one or more vapor chambers wherein the vapor chambers are configured to transfer heat between the one or more heat sources and the oscillating heat pipe.

The apparatus may comprise means for detecting whether the flexible portion is in an open configuration or a closed configuration and causing a first thermal management strategy for the one or more heat sources to be implemented if the flexible portion is in the open configuration and causing a second thermal management strategy to be implemented for the one or more heat sources if the flexible portion is in the closed configuration.

According to various, but not necessarily all, examples of the disclosure there may be provided an electronic device comprising an apparatus as described herein wherein the electronic device comprises one or more of: a mobile phone, a teleconferencing device, a television.

While the above examples of the disclosure and optional features are described separately, it is to be understood that their provision in all possible combinations and permutations is contained within the disclosure. It is to be understood that various examples of the disclosure can comprise any or all of the features described in respect of other examples of the disclosure, and vice versa. Also, it is to be appreciated that any one or more or all of the features, in any combination, may be implemented by/comprised in/performable by an apparatus, a method, and/or computer program instructions as desired, and as appropriate.

BRIEF DESCRIPTION

Figure 2B:
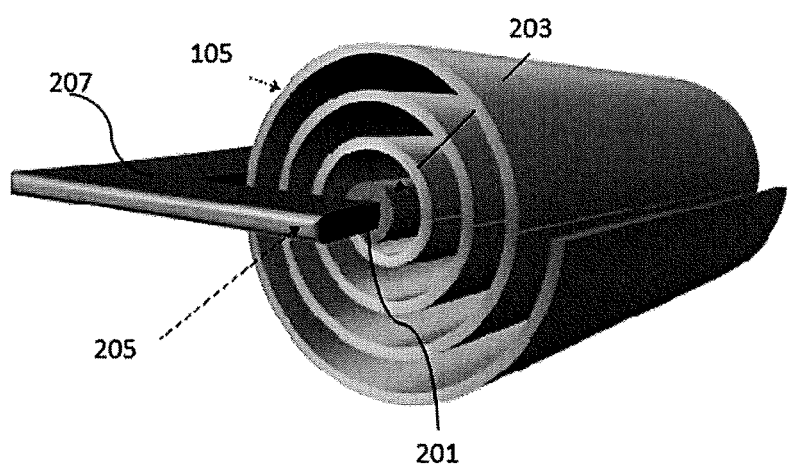

Some examples will now be described with reference to the accompanying drawings in which:

FIGS. 1A to 1C schematically show an example apparatus;

FIGS. 2A and 2B show part of an example apparatus; and

Figure 3:
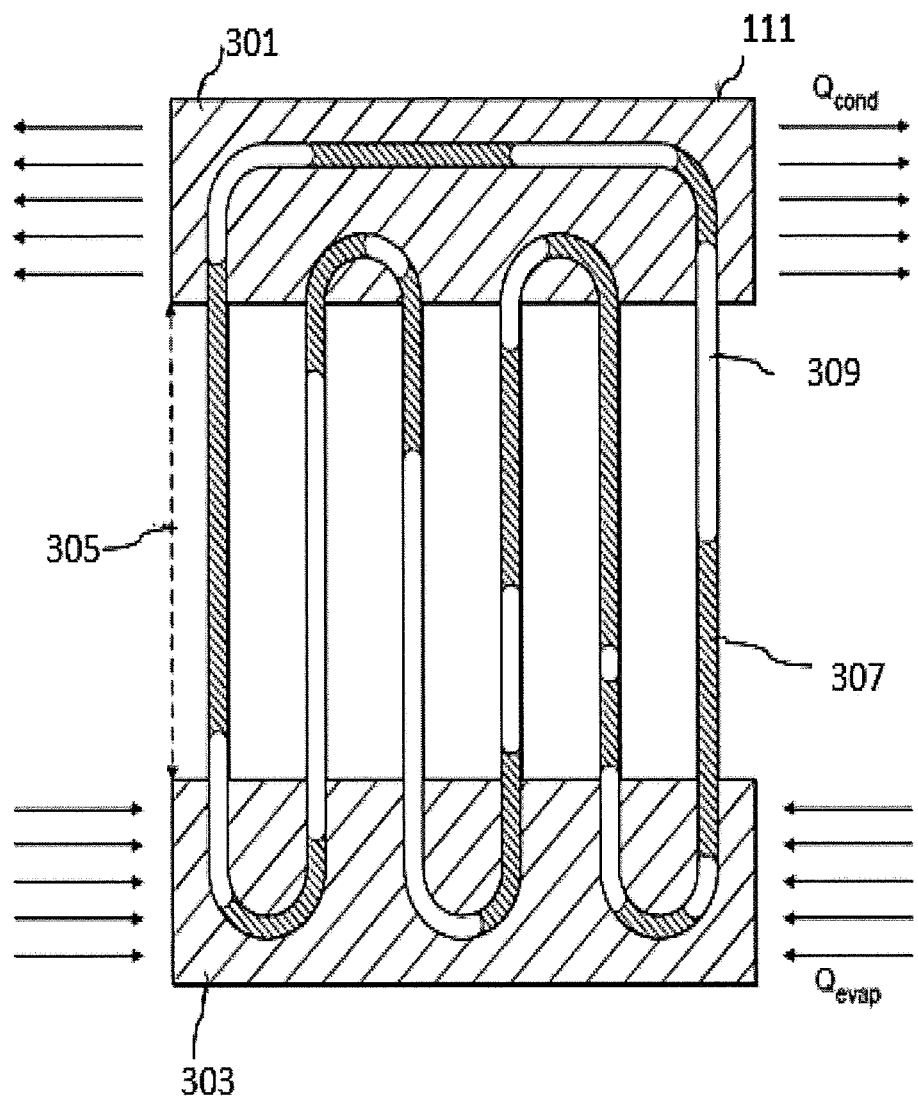

FIG. 3 schematically shows an oscillating heat pipe.

The figures are not necessarily to scale. Certain features and views of the figures can be shown schematically or exaggerated in scale in the interest of clarity and conciseness. For example, the dimensions of some elements in the figures can be exaggerated relative to other elements to aid explication. Corresponding reference numerals are used in the figures to designate corresponding features. For clarity, all reference numerals are not necessarily displayed in all figures.

DETAILED DESCRIPTION

Examples of the disclosure relate to an apparatus with a flexible display. The flexible display can be moved between an open configuration and a closed configuration. In the closed configuration the flexible display is housed within a housing. In the open configuration the flexible display is not housed in the housing. In the open configuration the flexible display can provide a large surface area. In examples of the disclosure an oscillating heat pipe is thermally coupled to the flexible display to enable the large surface area of the flexible display to be used for improving cooling of electronic components that might be comprised within the housing.

FIGS. 1A to 1C schematically show an example apparatus 101 according to examples of the disclosure. The example apparatus 101 comprises a housing portion 103 and a flexible portion 105. The apparatus 101 could comprise additional features that are not shown in FIGS. 1A to 1C.

FIGS. 1A and 1B show the apparatus 101 in an open configuration. FIG. 1 C shows the apparatus 101 in a closed configuration. FIGS. 1A and 1C show a side view of the apparatus 101 and FIG. 1B shows a front view of the apparatus 101.

The housing 103 can comprise a rigid casing that is configured to enclose or at least partially enclose one or more heat sources 107 or other components of the apparatus 101. The housing 103 can be configured to protect the one or more heat sources 107 or other components. For example, it can protect the heat sources 107 or other components from impacts and/or from dirt, fluids and other contaminants.

The housing 103 can be formed from a rigid plastic or any other suitable material. The housing 103 is rigid in that it cannot be easily deformed by a user of the apparatus 101 during normal use of the apparatus 101.

In the example of FIGS. 1A to 1C the housing 103 has a cuboid, or substantially cuboid, shape. The housing 103 has rectangular cross sections. Other shapes for the housing 103 could be used in other examples of the disclosure.

One or more heat sources 107 are contained within the housing 103. The heat sources 107 could be a component that generates unwanted heat during use of the apparatus 101. For example, the heat sources 107 could be an electronic or photonic component such as a battery or processing unit.

In the example of FIG. 1 the heat sources 107 are shown as discrete components. In some examples the heat sources 107 can be integrated for instance the components 1 heat sources 107 could comprise integrated circuits or any other suitable type of components or combinations of components.

Two heat sources 107 are shown in FIGS. 1A to 1C. Any number of heat sources could be contained within the housing 103 in other examples.

The flexible portion 105 configured to be moved between a closed configuration and an open configuration. In the closed configuration the flexible portion 105 is housed in the housing 103. FIG. 1C shows the flexible portion 105 in the closed configuration. In this example the flexible portion 105 is entirely contained within the housing 103. In other examples, the flexible portion 105 could be housed within the housing 103 so that a small section of the flexible portion 105 is not within the housing 103. For example, a small section of the flexible portion 105 could be positioned on or outside of the surface of the housing 103. This could enable a user of the apparatus 101 to pull the flexible portion 105 into the open configuration.

In the open configuration the flexible portion 105 is positioned outside of the housing 103. FIGS. 1A and 1B show the flexible portion 105 in the open configuration. In this example the flexible portion 105 is entirely positioned outside of the housing 103. In other examples, the flexible portion 105 could be positioned outside of the housing 103 so that a small section of the flexible portion 105 is retained within the housing 103. For example, a small section of the flexible portion 105 could be coupled to a mechanism within the housing 103. The mechanism could enable the flexible portion 105 to be moved between the open configuration and the closed configuration.

The flexible portion 105 is flexible in that it can be rolled or bent. The flexibility of the flexible portion 105 enables the flexible portion 105 to be folded or bent into a compact configuration that can be housed within the housing 103. This can provide for a compact form factor that is convenient for transporting the apparatus 101 and/or for storing the apparatus 101. The flexibility of the flexible portion 105 also enables the flexible portion 105 to be arranged into a flat or substantially flat configuration. The flat configuration provides a large surface are of the flexible portion. This large surface area can be used to display images or to enable any other suitable functions to be performed.

The flexible portion 105 comprises a flexible display 109 and an oscillating heat pipe 111. The flexible portion 105 could comprise other components in other examples of the disclosure.

The flexible display 109 can comprise any means for displaying images that can be rolled or bent between the open and closed configurations. In some examples the flexible display 109 can comprise an array of light emitting diodes. The array of light emitting diodes can be configured so that moving the flexible display 109 between the open and closed configurations does not damage the light emitting diodes. The light emitting diodes could comprise organic light emitting diodes (OLEDs) or any other suitable type of diodes.

The flexible display 109 can be controlled by a controller or other suitable means that could be housed within the housing 103. The flexible display 109 can be electronically coupled to the controller or any other suitable means to enable images to be displayed on the flexible display 109 when the flexible display 109 is in the open configuration.

The oscillating heat pipe 111 is flexible and is configured to move with the flexible portion 105 between the closed configuration and the open configuration. The oscillating heat pipe 111 can be formed from a flexible material such a polymer or any other suitable material.

The oscillating heat pipe 111 can comprise means for transferring heat from the one or more heat sources 107 in the housing 103 to the surface of the foldable portion 105. One or more intervening components can be provided between the heat source 107 and the oscillating heat pipe 111. One or more intervening components can be provided between the oscillating heat pipe 111 and the surface of the foldable portion 105.

The oscillating heat pipe 111 comprises one or more evaporator regions and one or more condenser regions. The evaporator regions and condenser regions are shown in more detail in FIG. 3.

The one or more evaporator regions of the oscillating heat pipe 111 can be positioned in the flexible portion so that they are close to the housing 103 or are located in the housing 103. The one or more evaporator regions are thermally coupled to one or more heat sources 107 to allow for heat transfer into the oscillating heat pipe 111. In some examples the evaporator region could be thermally coupled to a single heat source 107. In other examples the evaporator region could be thermally coupled to a plurality of different heat sources 107. The one or more evaporator regions could be directly connected to the one or more heat sources 107 so that there are no intervening components between the heat sources 107 and the one or more evaporator regions. In other example intervening components could be used to transfer heat from the heat sources 107 to the one or more evaporator regions. For instance, one or more vapor chambers can be configured to transfer heat between the heat sources 107 and the one or more evaporator regions of the oscillating heat pipe 111.

One or more of the condenser regions are located in the flexible portion 105. The one or more condenser regions can be located in the flexible portion 105 so that they are not close to the housing 103 when the flexible portion 105 is in an open configuration. For instance, the one or more of the condenser regions could be located towards a distal end of the flexible portion 105. The distal end could be the end of the flexible portion 105 that is opposite to the end that is attached to the housing 103.

The one more the condenser regions are coupled to a heat sink to allow for heat transfer out of the oscillating heat pipe 111. The heat sink could be a heat spreader, a vapour chamber or any other suitable means for removing heat from the oscillating heat pipe 111.

In the examples of FIGS. 1A to 1C the oscillating heat pipe 111 is positioned behind the flexible display 109 in the flexible portion 105. This means that the oscillating heat pipe 111 does not obstruct the images displayed by the flexible display 109. Other positions for the oscillating heat pipe 111 could be used in other examples of the disclosure.

The oscillating heat pipe 111 can be configured to have any suitable size or shape within the foldable portion 105. In the example of FIG. 1B the oscillating heat pipe 111 is distributed over all of, or substantially all of, the area of the foldable portion 105. This can enable all of, or substantially all of the surface area of the flexible portion 105 to be used to transfer heat away from the heat sources 107.

In the example of FIGS. 1A to 1C the flexible portion 105 is thin. The flexible portion 105 is thin in that the depth of the flexible portion 105 us much smaller than the height and width of the flexible portion 105. The flexible portion 105 could be several millimeters thick or even thinner whereas the height and width of the flexible portion 105 could be several cm or even over a meter in the case of televisions.

Having a thin flexible portion 105 can make it easier to move the flexible portion 105 between the open and closed configurations. This can also make it easier to fit the flexible portion 105 inside the housing 103 in the closed configuration because the thin flexible portion 105 will not require much volume for storage.

Having a thin flexible portion 105 can also improve the efficiency of the heat transfer by the oscillating heat pipe 111 because it can enable either surface of the flexible portion 105 to be used or rejecting heat.

The apparatus 101 is therefore configured so that, when the apparatus 101 is in an open configuration heat from the heat sources 107 in the housing can be transferred into the oscillating heat pipe 111. The oscillating heat pipe 111 can then transfer the heat to the one or more condenser regions in the flexible portion 105. The relatively large surface area of the flexible portion 105 can then be used to enable heat to be transferred out of the oscillating heat pipe 111. For instance, the surface area of the flexible portion 105 can allow for cooling by convection from the respective surfaces. As the flexible portion 105 can be thin this can enable both of the surfaces of the flexible portion 105 to be used for cooling by convection which can improve the efficiency of the heat transfer. The apparatus 101 therefore provides for cooling of heat sources 107 within electronic devices comprising flexible portions.

The oscillating heat pipe 111 provides a passive cooling system for the apparatus 101. The cooling system is passive in that it does not require a pump or other driver to move working fluid within the oscillating heat pipe 111. The oscillating heat pipe 111 can be designed so that the apparatus 101 can function in different orientations. The efficiency of the apparatus 101 can be improved if the oscillating heat pipe 111 is configured so that the movement of working fluid in the oscillating heat pipe 111 is aided by gravity.

The apparatus 101 according to examples of the disclosure can be provided in any suitable types of devices. In some examples the apparatus 101 could be provided in portable devices such as mobile phones or other types of communication devices. In such cases the closed configuration can provide a compact configuration that makes the portable device easy to transport. For instance, having the flexible portion 105 in a closed configuration can enable the portable device to be transported in a user's pocket or bag for example. The open configuration can provide a large surface area for a display or user interface or other suitable means.

In some examples the apparatus 101 could be provided in electronic devices that are not portable. For instance, the apparatus 101 could be provided in a wall mounted display that could be part of a television of conferencing system. In these examples, having the flexible portion 105 in a closed configuration can enable the device to be stored compactly so that it Is not taking up a large area of a wall or room. The open configuration can provide a large surface area for a display or user interface or other suitable means.

Various modifications and/or additions could be made to the apparatus 101 in implementations of the disclosure.

For instance, in the examples of FIGS. 1A to 1C the flexible portion 105 is shown as a rollable portion. Other types of flexible portion 105 could be used in other examples. For instance, the flexible portion 105 could be a foldable portion that could be folded into the housing 103 in a concertina arrangement.

In some examples the heat transferred by the oscillating heat pipe 111 could be used to heat one or more components in the flexible portion 105. For instance, if the flexible display 109 comprises organic light emitting diodes (OLEDs) these can operate more efficiently at a temperature that is higher than ambient temperature. In such cases the condenser region of the oscillating heat pipe 111 can be designed so that the heat transferred out of the oscillating heat pipe 111 is used to heat the OLEDs. This can improve the efficiency of the flexible display 109. Therefore, in these cases the oscillating heat pipe 111 is configured to transfer heat from a region where it is unwanted or disadvantageous, to a region where the heat is beneficial.

In some examples the flexible portion 105 can comprise a diffusion barrier. The diffusion barrier can be configured to protect both the oscillating heat pipe 111 and the components of the display 109 such as the OLEDs. In other examples different diffusion barriers could be used to protect the respective components. For example, a first diffusion barrier could be used to protect the oscillating heat pipe 111 and a second diffusion barrier could be used to protect the OLEDs or other components of the flexible portion 105.

The diffusion barrier can be configured to help to prevent working fluid from leaking out of the oscillating heat pipe 111 and/or to help to prevent ingress of non-condensable gases into the oscillating heat pipe 111. The diffusion barrier can be formed from any suitable material.

In some examples the pressure within the oscillating heat pipe 111 can be above atmospheric pressure. The pressurization of the working fluid within the oscillating heat pipe 111 can help to provide a structural rigidity to the oscillating heat pipe 111. This structural rigidity can help to support the flexible portion 105 and provide some structural rigidity to the flexible portion 105 when the flexible portion 105 is in the open configuration.

In some examples the oscillating heat pipe 111 can be designed so that the support provided by the pressurized oscillating heat pipe 111 can provide a particular shape for the flexible portion 105. For instance, the oscillating heat pipe 111 can be designed so that in the open configuration the flexible portion 105 is concave or convex or in any other suitable configuration.

The oscillating heat pipe 111 can be moved between the open and closed configurations, even when the working fluid is pressurized, due to the compressibility of the vapor within the oscillating heat pipe 111.

The working fluid used in the oscillating heat pipe 111 can be selected so as to reduce or minimize the diameter for the oscillating heat pipe 111. In such examples the working fluid that is used within the oscillating heat pipe 111 can be selected to have a small confinement number. In some examples the working fluid is selected to have a confinement number less than one. The suggested confinement number can be between 0.8 and 1.

The confinement number is given by:

$$Co = l_c/2r_i,$$

where $l_c = \sqrt{\gamma/(g\Delta\rho)}$ is the capillary length, $\gamma$ is the working fluid surface tension, g is the acceleration due to gravity, $\Delta\rho$ is the density difference between the liquid and vapour phase of the working fluid and $r_i$ is the inner radius of the oscillating heat pipe 111.

Having a small confinement number, for example a confinement number below one, reduces the impact of surface tension related instabilities on the functioning of the oscillating heat pipe 111.

The working fluid that is used within the oscillating heat pipe 111 can comprise fluorine. For example, the working fluid could be R236fa, R1233zd, R245fa or any other suitable working fluid. Such working fluids have characteristically small $\gamma$ and large $\Delta\rho$ and so provide low confinement numbers. Such working fluids are dielectric and may have low global warming potential (GWP) values.

The oscillating heat pipe 111 can be configured to reduce or minimize the effects of ingress of non-condensable gases from the atmosphere into the oscillating heat pipe 111. The non-condensable gases, such as oxygen and nitrogen could diffuse into the oscillating heat pipe 111. Such gases would degrade the performance of the oscillating heat pipe 111. In some examples the oscillating heat pipe 111 could comprise a diffusion barrier, as described above, which could restrict the ingress of the non-condensable gases.

In some examples the working fluid that is used within the oscillating heat pipe 111 is configured to have a vapour pressure that is high enough to reduce effects of ingress of non-condensable gases into the oscillating heat pipe 111. The working fluid can be selected to have a high vapour pressure (low boiling point) so that if the concentration of non-condensable gases within the oscillating heat pipe 111 is equilibrated with the external pressure the mass fraction of the non-condensable gases remains low relative to the working fluid. This ensures that the thermal performance of the oscillating heat pipe 111 remains high. Working fluids such as R236fa, R1233zd, R245fa have suitably high vapour pressures at operating temperatures of the oscillating heat pipe 111.

In some examples the oscillating heat pipe 111 can be formed from polymer. The polymer that is used can be selected so as to reduce interaction between the oscillating heat pipe 111 and the working fluid. The polymer can be selected to have a good chemical compatibility and low mass uptake with respect to the working fluid. The polymer that is used can be weakly permeable to a high molecular weight working fluid. For instance, if R1233zd is used as the working fluid then suitable polymers for the oscillating heat pipe 111 could comprise Epichlorohydrin rubber (ECO), Neoprene, silicone, or Butyl.

The oscillating heat pipe 111 could be weakly permeable to the working fluid and so in some examples the oscillating heat pipe 111 can be configured to reduce or minimize this fluid loss. For instance, in some examples the surface area of oscillating heat pipe 111 can be minimized. In some examples the oscillating heat pipe 111 can be overfilled to begin with so as to allow for a predictable, but acceptable, change in the thermal performance of the oscillating heat pipe 111 during the lifetime of apparatus 101. For instance, the initial charging ratio could be between 50 to 80% and could drop, over the lifetime of the apparatus 101, to around 20% which would still provide an acceptable thermal performance.

The polymer that is used for the oscillating heat pipe 111 can be selected to have sufficient tensile strength to avoid bursting of the oscillating heat pipe 111 as the flexible portion 105 is moved between the open configuration and the closed configuration. The burst pressure for the oscillating heat pipe 111 is given by:

$$\Delta p_{burst} = \frac{\sigma_T(r_o^2 - r_i^2)}{r_i^2\left(1 + \frac{r_o^2}{r_i^2}\right)},$$

where $\sigma_T$ is the tensile strength of the polymer used for the bendable region 301, $r_o$ is the outer radius of the oscillating heat pipe 111 and r is the inner radius of the oscillating heat pipe 111.

Due to the small dimensions of the oscillating heat pipe 111 that would be used in examples of the disclosure the burst pressures can be very large. As an example, Neoprene has $\sigma_T$~34.5 bar (Shore A 40 hardness), typical dimensions for the oscillating heat pipe 101 could be $r_o/r_i$=0.5 mm/0.2 mm and a safety factor of 3, this gives $\Delta p_{burst}/3$=8.3 bar. This compares favorably with R236fa saturation pressure of 6.7 bar at 55° C.

The oscillating heat pipe 111 can also be designed to reduce ingress of non-condensable gases into the oscillating heat pipe 111. For example, the oscillating heat pipe 111 can be designed to reduce the diffusion of non-condensable gases across the polymer of the oscillating heat pipe 111. It can be difficult to prevent ingress of such gases due to the small molecular size of diatomic oxygen and nitrogen. In some examples a diffusion barrier, as mentioned above, can be used. In some examples selection of working fluid could be used instead of, or in addition to the diffusion barrier. For example, a working fluid with a low boiling point (high vapor pressure) can be used so that even if the concentration of non-condensable gases in the oscillating heat pipe 111 reaches equilibrium with the external pressure, the mass fraction of non-condensable gases remains low relative to the working fluid so that thermal performance of the oscillating heat pipe 111 remains high. Working fluids such as R236fa, R1233zd, R245fa demonstrate high vapor pressures at the oscillating heat pipe 111 operating temperature and could be suitable choices. Other fluids could be used in other examples.

In some examples the oscillating heat pipe 111 can be designed so that it has different diameters at different sections. For instance, the oscillating heat pipe 111 could comprise a first section having a first diameter and a second section having a second diameter. The different diameters can enable different heat transfer rates by the respective sections. This can enable different levels of cooling to be provided for different parts of the apparatus 101. For instance, a first heat source 107 could generate more unwanted heat than a second heat source 107. In these cases, the section of the oscillating heat pipe 111 that transfers heat away from the first heat source 107 could have a larger diameter than the section of the oscillating heat pipe 111 that transfers heat away from the second heat source 107. This can enable a higher rate of cooling to be provided to the heat sources 107 that requires the most cooling.

In some examples the apparatus 101 can comprise a detector or other suitable means for detecting whether the flexible portion 105 is in the open configuration or the closed configuration. For instance, a sensor could be located in the housing 103 and used to detect the position of the flexible portion 105. The detector can cause a thermal management strategy for the heat sources 107 to be implemented based on the detected position of the flexible portion 105. For instance, a first thermal management strategy can be implemented if the flexible portion 105 is detected to be in the open configuration and a second thermal management strategy can be implemented if the flexible portion 105 is detected to be in the closed configuration. The first thermal management strategy could allow the temperatures of the one or more heat sources 107 to exceed a threshold temperature because efficient heat transfer is available through the oscillating heat pipe 111 and the surface of the flexible portion 105. The second thermal management strategy could throttle the operation of the one or more heat sources 107 and prevent them from exceeding the threshold temperature because efficient heat transfer is not available through the oscillating heat pipe 111 and the surface of the flexible portion 105 when the flexible portion 105 is inside the housing 103.

FIGS. 2A and 2B show part of an example apparatus 101. In this example the flexible portion 105 is shown in a closed configuration. The housing 103 is not shown in FIGS. 2A and 2B. The flexible portion 105 is shown in a side view in FIG. 2A and a perspective view in FIG. 2B. The flexible portion 105 can comprise a flexible display 109 and an oscillating heat pipe 111. The flexible display 109 and the oscillating heat pipe 111 can be as described above or in any other suitable arrangement. The flexible display 109 and the oscillating heat pipe 111 are not shown in FIGS. 2A and 2B.

FIGS. 2A and 2B show a mechanism 201 for moving the flexible portion 105 between the open configuration and the closed configuration. In this example the flexible portion 105 is a rollable portion comprising a rollable display and the mechanism 201 comprises a roller mechanism. Other types of mechanism 201 could be used for other types of flexible portions 105 such as foldable portions.

The mechanism 201 comprises a rotatable member 203 and a non-rotatable member 205. The mechanism 201 could comprise additional components that are not shown in FIGS. 2A and 2B.

The rotatable member 203 is configured to rotate. The rotatable member 203 is mechanically coupled to an end of the flexible portion 105 so that rotation of the rotatable member 203 causes movement of the flexible portion 105. The flexible portion 105 can be coupled to the rotatable member 203 so that rotation of the rotatable member 203 in a first direction causes the flexible portion 105 to be moved toward the closed configuration. In the example of FIG. 2A this direction would be a clockwise direction. In the closed configuration the flexible portion 105 is wrapped around the rotatable member 203.

The flexible portion 105 can be coupled to the rotatable member 203 so that rotation of the rotatable member 203 in a second direction causes the flexible portion 105 to be moved toward the open configuration. In the example of FIG. 2A this direction would be an anti-clockwise direction. In the open configuration the flexible portion 105 is not wrapped around the rotatable member 203.

The rotatable member 203 is coupled to the non-rotatable member 205. The rotatable member 203 can be thermally and mechanically coupled to the non-rotatable member 205.

The non-rotatable member 205 is configured so that it does not rotate when the rotatable member 203 rotates. The non-rotatable member 205 can be fixed in position within the housing 103 so that the non-rotatable member 205 does not move relative to the housing 103 and other components within the housing.

In some examples the non-rotatable member 205 can be configured to secure the rotatable member 203 in position within the housing 103 while allowing rotation of the rotatable member 103. For example, the non-rotatable member 205 can be configured to enable rotation of the rotatable member 203 but can be configured to restrict translational movement of the rotatable member 203.

In the example of FIGS. 2A and 2B the non-rotatable member 205 comprises a planar portion 207. The planar portion 207 comprises a flat or substantially flat surface. In the example mechanism 201 a gap is provided between the rotatable member 203 and the planar portion 207 so that when the flexible portion 105 is rolled up in the closed configuration part of the rolled up flexible portion is positioned in the gap.

In some examples one or more heat sources 107 can be mounted on, or embedded in the planar portion 207. This can enable the one or more heat sources 107 to be thermally coupled to the non-rotatable member 205. In other examples the heat sources 107 might not be mounted on, or embedded in, the planar portion 207 but could be otherwise be thermally coupled to the non-rotatable member 205. For example, one or more vapor chambers could be used to thermally connect a heat source 107 to the non-rotatable member 205.

The rotatable member 203 can be thermally coupled to the non-rotatable member 205 so that heat from the non-rotatable member 205 can be transferred to the rotatable member 203. This heat can be heat from one or more heat sources 107.

The oscillating heat pipe 111 of the flexible portion 105 can be thermally coupled to the rotatable member 203. This can enable heat from the rotatable member 203 to be transferred to the oscillating heat pipe 111. For example, one or more evaporator regions of the oscillating heat pipe 111 can be positioned close to the rotatable member 203 so that heat from the rotatable member 203 heats working fluid in the evaporator regions of oscillating heat pipe 111.

If the flexible portion 105 is in an open configuration oscillating heat pipe 111 can then transfer the heat away from the housing 103 and to the large surface area of the open flexible portion 105. The mechanism 201 therefore enables rotation of the flexible portion 105 and also efficient heat transfer from the heat sources 107 to the oscillating heat pipe 111.

FIG. 3 schematically shows an example oscillating heat pipe 111 that could be used in examples of the disclosure. The oscillating heat pipe 111 comprises a condenser region 301, an evaporator region 303 and an adiabatic section 305.

The evaporator region 303 comprises any means for transferring heat from a heat source 111 into the working fluid within the oscillating heat pipe 111. The evaporator region 303 is thermally coupled to a heat source 107. In this example the heat sources 107 can be any one or more of the heat sources 107 in the housing 103 of the apparatus 101.

The condenser region 301 comprises any means for transferring heat out of the working fluid within the oscillating heat pipe 111. The condenser region 301 is thermally coupled to a heat sink or any other suitable type of means for transferring heat out of the working fluid. The heat sink could be a heat rejection surface or any other suitable means. The heat sink can be within the flexible portion 105 of the apparatus 101.

The oscillating heat pipe 111 is configured in a meandering or serpentine configuration comprising a plurality of bends. A first plurality of bends is located in the evaporator region 303 and a second plurality of bends is located in the condenser region 301.

In the example shown in FIG. 3 three U-shaped bends are shown in the evaporator region 303 and two U-shaped bends are shown in the condenser region 301. Other configurations and numbers of bends could be used in other examples of the disclosure. For instance, in other examples the bends might not be U-shaped. The meandering or serpentine configuration is configured so that the working fluid within the oscillating heat pipe 111 is alternately heated in the evaporator region 303 and cooled in the condenser region 301 of the oscillating heat pipe 111.

In the example shown in FIG. 3 the oscillating heat pipe 111 forms a closed loop. Other types of oscillating heat pipe 111 could be used in other examples of the disclosure.

In the example shown in FIG. 3 an adiabatic section 305 is provided between the evaporator region 303 and the condenser region 301. The adiabatic section 305 extends between the bends in the condenser region 301 and the bends in the evaporator region 303. The adiabatic section 305 ensures that heat that is transferred into the working fluid in the evaporator region 303 is retained within the oscillating heat pipe 111 until the working fluid reaches the condenser region 301. In some examples the oscillating heat pipe 111 does not comprise an adiabatic section 305. Whether or not the oscillating heat pipe 111 comprises an adiabatic section 305 can depend on the application and system geometry of the oscillating heat pipe 111 and any other suitable factors.

When the oscillating heat pipe 111 is in use, heat is applied to the working fluid in the bends within the evaporator region 303. This heat causes, at least some of, the working fluid to evaporate. This evaporation results in an increase of vapour pressure inside the oscillating heat pipe 111 which causes the growth of bubbles 309 within the evaporator region 303. The growth of the bubbles 309 and the increase in vapour pressure forces liquid slugs 307 of the working fluid towards the condenser region 301. The working fluid that is pushed to the condenser region 301 is then cooled by the condenser. This cooling reduces the vapour pressure within the working fluid and causes condensation of the bubbles 309 and provides a restoring force that pushes the working fluid back towards the evaporator region 303. This process of alternate bubble growth and condensation causes oscillation of the working fluid within the oscillating heat pipe 111 and allows for an efficient heat transfer between the evaporator region 303 and the condenser region 301.

The example oscillating heat pipe 111 in FIG. 3 comprises a single loop with a single evaporator region 303. In some examples the oscillating heat pipe 111 could comprise a plurality of loops. The different loops could comprise different evaporator regions 303. The different evaporator regions could be configured to dissipate heat from different heat sources 111 within the housing of the apparatus 101. Having the plurality of loops can provide for design flexibility within the oscillating heat pipe 111. This can enable the number of bends and the geometry of the oscillating heat pipe 111 to be optimized, or substantially optimized, for dissipating heat from the different heat sources 111 within the housing of the apparatus 101.

In this description and claims the term coupled means operationally coupled. Any number or combination of intervening elements can exist between coupled components, including no intervening elements.

The apparatus can be provided in an electronic device, for example, a mobile terminal, according to an example of the present disclosure. It should be understood, however, that a mobile terminal is merely illustrative of an electronic device that would benefit from examples of implementations of the present disclosure and, therefore, should not be taken to limit the scope of the present disclosure to the same. While in certain implementation examples, the apparatus can be provided in a mobile terminal, other types of electronic devices, such as, but not limited to: mobile communication devices, hand portable electronic devices, wearable computing devices, portable digital assistants (PDAs), pagers, mobile computers, desktop computers, televisions, gaming devices, laptop computers, cameras, video recorders, GPS devices and other types of electronic systems, can readily employ examples of the present disclosure. Furthermore, devices can readily employ examples of the present disclosure regardless of their intent to provide mobility.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this description, the wording 'connect', 'couple' and 'communication' and their derivatives mean operationally connected/coupled/in communication. It should be appreciated that any number or combination of intervening components can exist (including no intervening components), i.e., so as to provide direct or indirect connection/coupling/communication. Any such intervening components can include hardware and/or software components.

As used herein, the term "determine/determining" (and grammatical variants thereof) can include, not least: calculating, computing, processing, deriving, measuring, investigating, identifying, looking up (for example, looking up in a table, a database or another data structure), ascertaining and the like. Also, "determining" can include receiving (for example, receiving information), accessing (for example, accessing data in a memory), obtaining and the like. Also, "determine/determining" can include resolving, selecting, choosing, establishing, and the like.

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example.

Although examples have been described in the preceding paragraphs with reference to various examples, it should be appreciated that modifications to the examples given can be made without departing from the scope of the claims.

Features described in the preceding description may be used in combinations other than the combinations explicitly described above.

Although functions have been described with reference to certain features, those functions may be performable by other features whether described or not.

Although features have been described with reference to certain examples, those features may also be present in other examples whether described or not.

The term 'a', 'an' or 'the' is used in this document with an inclusive not an exclusive meaning. That is any reference to X comprising a/an/the Y indicates that X may comprise only one Y or may comprise more than one Y unless the context clearly indicates the contrary. If it is intended to use 'a', 'an' or 'the' with an exclusive meaning then it will be made clear in the context. In some circumstances the use of 'at least one' or 'one or more' may be used to emphasis an inclusive meaning but the absence of these terms should not be taken to infer any exclusive meaning.

The presence of a feature (or combination of features) in a claim is a reference to that feature or (combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

The above description describes some examples of the present disclosure however those of ordinary skill in the art will be aware of possible alternative structures and method features which offer equivalent functionality to the specific examples of such structures and features described herein above and which for the sake of brevity and clarity have been omitted from the above description. Nonetheless, the above description should be read as implicitly including reference to such alternative structures and method features which provide equivalent functionality unless such alternative structures or method features are explicitly excluded in the above description of the examples of the present disclosure.

Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

We claim:

1. An apparatus comprising:
a housing portion comprising one or more heat sources;
a flexible portion configured to be moved between a closed configuration and an open configuration wherein in the closed configuration the flexible portion is housed in the housing portion and in the open configuration the flexible portion is positioned outside of the housing; and
wherein the flexible portion comprises a flexible display and an oscillating heat pipe and the oscillating heat pipe is coupled to the one or more heat sources in the housing portion and the oscillating heat pipe is flexible and configured to move with the flexible portion between the closed configuration and the open configuration and wherein one or more condenser regions of the oscillating heat pipe are positioned in the flexible portion.

2. An apparatus as claimed in claim 1 wherein the oscillating heat pipe is positioned behind the flexible display in the flexible portion.

3. An apparatus as claimed in claim 1 wherein the one or more condenser regions in the flexible portion are configured to enable surfaces of the flexible portion to be used as heat rejection surfaces.

4. An apparatus as claimed in claim 1 wherein the flexible portion is a rollable portion.

5. An apparatus as claimed in claim 4 wherein the housing comprises a rotatable member and one end of the rollable portion is coupled to the rotatable member such that rotation of the rotatable member enables the rollable portion to be moved between the open configuration and the closed configuration.

6. An apparatus as claimed in claim 5 wherein the rotatable member is thermally coupled to a non-rotatable member and one or more heat sources are thermally coupled to the non-rotatable member.

7. An apparatus as claimed in claim 1 wherein the flexible display comprises organic light emitting diodes.

8. An apparatus as claimed in claim 1 wherein the oscillating heat pipe is configured to transfer heat to one or more organic light emitting diodes in the flexible display.

9. An apparatus as claimed in claim 1 wherein pressure within the oscillating heat pipe is above atmospheric pressure so that the oscillating heat pipe provides structural rigidity to the flexible portion when the flexible portion is in the open configuration.

10. An apparatus as claimed in claim 1 wherein the oscillating heat pipe comprises a polymer.

11. An apparatus as claimed in claim 1 wherein the flexible portion comprises a diffusion barrier.

12. An apparatus as claimed in claim 1 wherein the oscillating heat pipe comprises a first section having a first diameter and a second section having a second diameter such that the different diameters enable different heat transfer rates with the respective sections.

13. An apparatus as claimed in claim 1 comprising one or more vapor chambers wherein the vapor chambers are configured to transfer heat between the one or more heat sources and the oscillating heat pipe.

14. An electronic device comprising an apparatus as claimed in claim 1 wherein the electronic device comprises one or more of: a mobile phone, a teleconferencing device, or a television.

* * * * *